US008368205B2

(12) United States Patent
Ankireddi et al.

(10) Patent No.: US 8,368,205 B2
(45) Date of Patent: Feb. 5, 2013

(54) METALLIC THERMAL JOINT FOR HIGH POWER DENSITY CHIPS

(75) Inventors: Seshasayee Ankireddi, Redwood City, CA (US); Vadim Gektin, Redwood City, CA (US); James A. Jones, Redwood City, CA (US); Margaret B. Stern, Redwood City, CA (US)

(73) Assignee: Oracle America, Inc., Redwood City, CA (US)

( * ) Notice: Subject to any disclaimer, the term of this patent is extended or adjusted under 35 U.S.C. 154(b) by 229 days.

(21) Appl. No.: 12/971,737

(22) Filed: Dec. 17, 2010

(65) Prior Publication Data
US 2012/0153453 A1    Jun. 21, 2012

(51) Int. Cl.
*H01L 23/34* (2006.01)
(52) U.S. Cl. ............... 257/712; 438/122; 257/E23.031; 257/E23.051; 257/E23.103
(58) Field of Classification Search ............. 438/106, 438/112, 121, 122, 126; 257/675, 676, 706, 257/707, 712, 717, 718, 722, 796, E23.031, 257/E23.051, E23.103
See application file for complete search history.

(56) References Cited

U.S. PATENT DOCUMENTS

| | | | |
|---|---|---|---|
| 2007/0222472 A1* | 9/2007 | Raravikar et al. | 324/765 |
| 2007/0231953 A1* | 10/2007 | Tomita et al. | 438/106 |
| 2008/0001268 A1* | 1/2008 | Lu | 257/678 |
| 2008/0305321 A1* | 12/2008 | Raravikar et al. | 428/323 |

* cited by examiner

*Primary Examiner* — Brook Kebede
(74) *Attorney, Agent, or Firm* — Osha Liang LLP

(57) ABSTRACT

A method for the assembly of a semiconductor package that includes cleaning a surface of a chip and a surface of a heat removal device by reverse sputtering is given. The method includes sequentially coating the surface of the chip and the surface of the heat removal device with an adhesive layer, a barrier layer, and a protective layer over a target joining area. The chip and the heat removal device are placed into carrier fixtures and preheated to a target temperature. Then a metallic thermal interface material (TIM) preform is mechanically rolled onto the surface of the chip and the first and the second carrier fixtures are attached together such that the metallic TIM layer on the surface of the chip is joined to the coated surface of the heat removal device through a fluxless process. The method includes heating the joined carrier fixtures in a reflow oven.

18 Claims, 4 Drawing Sheets

METALLIC THERMAL JOINT FOR HIGH POWER DENSITY CHIPS

FIELD OF DISCLOSURE

Embodiments disclosed herein generally relate to methods in semiconductor device manufacturing. More specifically, embodiments disclosed herein relate to methods for the fluxless attachment of a heat removing device to a chip using a metallic thermal interface material (TIM).

BACKGROUND

The assembly of a semiconductor package plays an important role in thermal management. A conventional semiconductor package includes a lid, one or more die, a die interconnect, a substrate, a substrate interconnect, and lid-attach thermal interface material ("TIM").

The die is placed on the substrate through a die-attach process. Typically, the die-attach process involves attaching a flip-chip type die to the substrate by the die interconnect through a reflow process. The underfill is applied to the die interconnect. The lid-attach TIM is applied to the bottom side of the die (the side opposite the die interconnect). The lid is placed on the substrate, typically making contact with the die by way of the lid-attach TIM. The semiconductor package is cured at a curing temperature. The bond line thickness ("BLT") of the lid-attach TIM is determined by the co-planarity of the die, substrate, and lid, the application of the lid to the substrate, the characteristics of the lid-attach TIM, and the curing process of the assembled semiconductor package.

Conventional techniques for heat removal from a microprocessor, application specific integrated circuit ("ASIC"), integrated circuit ("IC"), or other printed circuit board ("PCB") component rely upon the use of the heatsink-attach TIM placed between the heat generating device and a heat rejecting device. Typically, a single heat rejecting device, i.e., a heatsink, spans several components on the heat generating device, i.e., a semiconductor package. The BLT of the heatsink-attach TIM determines the thermal path performance and cooling efficiency of the heat rejecting device.

SUMMARY

In general, in one aspect, the invention relates to a method for the assembly of semiconductor package that includes cleaning a surface of a chip and a surface of a heat removal device by reverse sputtering. The method also includes sequentially coating the surface of the chip and the surface of the heat removal device with an adhesive layer, a barrier layer, and a protective layer over a target joining area. The chip and the heat removal device are placed into a first and second carrier fixture, respectively and preheated to a target temperature. Then a metallic thermal interface material preform is placed on the surface of the chip. The metallic thermal interface material preform is mechanically rolled onto the surface of the chip and the first and the second carrier fixtures are attached together such that the metallic thermal interface material layer on the surface of the chip is joined to the coated surface of the heat removal device. The method also includes heating the joined carrier fixtures in a reflow oven.

Other aspects and advantages of the invention will be apparent from the following description and the appended claims.

DETAILED DESCRIPTION

Figure 1:
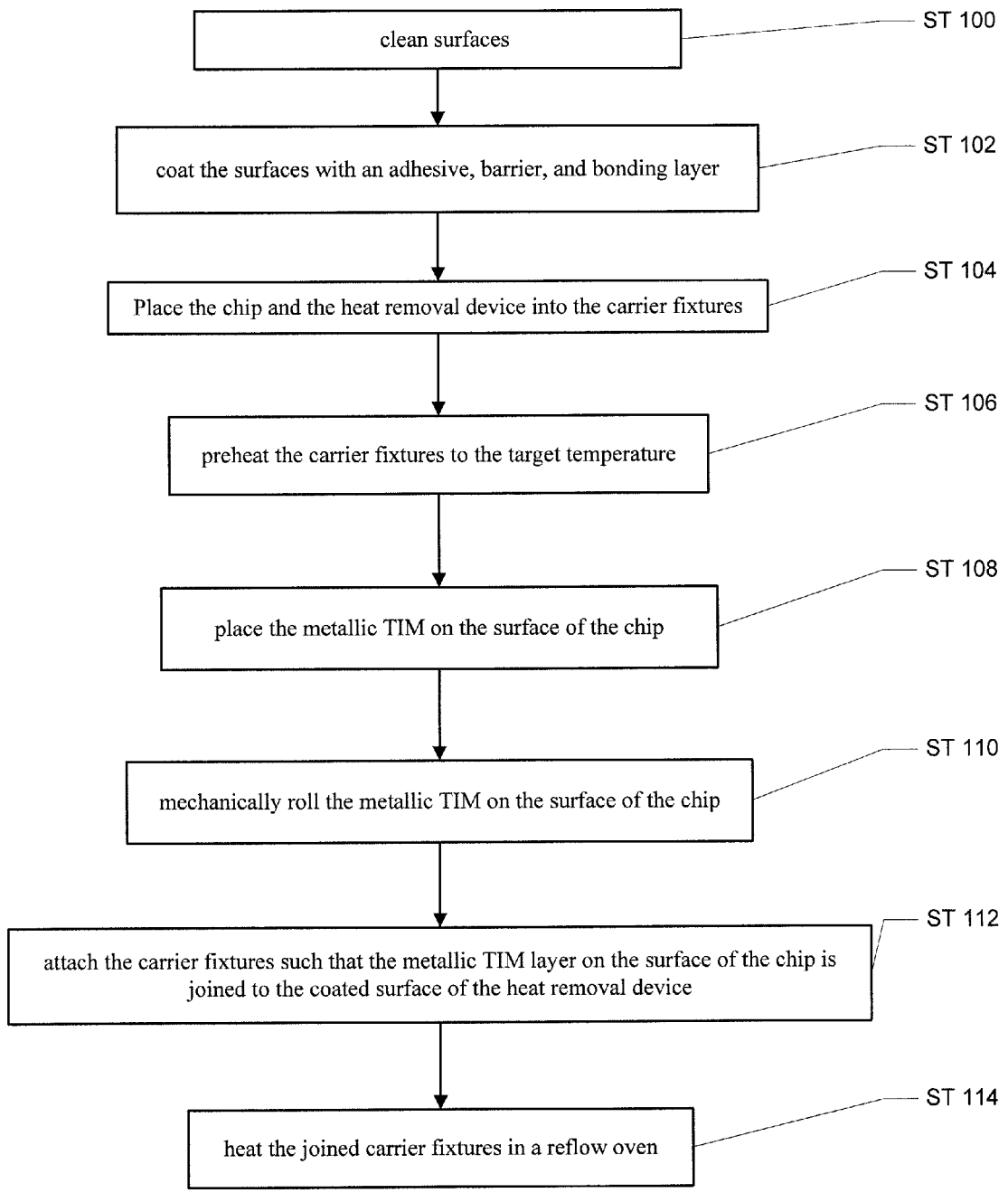
FIG. 1 shows a flow chart of a method in accordance with one or more embodiments disclosed herein.

Embodiments of the present disclosure will now be described in detail with reference to the accompanying Figures. Like elements in the various figures may be denoted by like reference numerals for consistency. Further, in the following detailed description of embodiments of the present disclosure, numerous specific details are set forth in order to provide a more thorough understanding of the claimed subject matter. However, it will be apparent to one of ordinary skill in the art that the embodiments disclosed herein may be practiced without these specific details. In other instances, well-known features have not been described in detail to avoid unnecessarily complicating the description.

In one aspect, embodiments disclosed herein generally relate to a method of semiconductor packaging. Specifically, embodiments disclosed herein generally relate to a method of employing a fluxless process and metallic TIM to thermally couple a die/chip and a heat removal device/lid.

Referring to FIG. 1, a method of semiconductor packaging in accordance with one or more embodiments is shown. In ST100, the surface of a chip, the surface of a heat removal device, and metallic TIM preform are cleaned. Specifically, in one or more embodiments, the surface of a chip, the surface of a heat removal device, and metallic TIM preform may be cleaned using acetone followed by isopropyl alcohol. In addition, the surface of a chip, the surface of a heat removal device, and metallic TIM preform may be mildly etched using hydrochloric acid at room temperature followed by rinsing with deionized water. After rinsing with deionized water, the surface of a chip, the surface of a heat removal device, and metallic TIM preform are then rinsed with acetone, followed by isopropyl alcohol, and blown dry using nitrogen. One of ordinary skill would appreciate that degreasing and cleaning the surface of a chip, the surface of a heat removal device, and metallic TIM preform is not limited to the steps described above, and that other solvents known in the art may be used to clean the surfaces.

The surface of the chip and the surface of the heat removal device may be cleaned using, for example, reverse sputtering. Reverse sputtering is a process known in the art by which the dislocation or removal of atoms or molecules from a surface of a material is performed by the impact energy of gas ions which are accelerated in an electric field. Reverse sputtering is just one embodiment of surface cleaning. Alternative approaches could be used, for example, mechanical cleaning, chemical etch, or plasma clean.

In one or more embodiments, the chip is a silicon based die package. In one or more embodiments the heat removal device is copper based lid.

In ST102, each of the chip and the heat removal device surfaces is coated with an adhesive layer, a barrier layer and a protective layer. The adhesive layer, barrier layer, and protective layer may be deposited by sputter coating. One of ordinary skill in the art will appreciate that the deposition of the adhesive layer, barrier layer, and protective layer is not limited to sputter coating. For example, chemical vapor deposition, electroless plating, or other techniques known in the art may be used.

The adhesive layer may facilitate further protection of the chip and heat removal device surface. The barrier layer may act to provide a barrier between the TIM and the surface of the chip and the heat removal device. The protective layer facilitates the bonding between the TIM and the surface of the chip and the heat removal device.

In accordance with one or more embodiments of the claimed invention the adhesive layer, a barrier layer and a protective layer cover 100% of the area targeted for joining the chip to the heat removal device or lid. The lid side plated area may be the same or slightly larger than on the die side to compensate for any misalignment.

In accordance with one or more embodiments disclosed herein, the adhesive layer is comprised primarily of a titanium layer approximately 0.1 µm (microns) thick. One of ordinary skill in the art will appreciate that the adhesive layer material is not limited to titanium, and its thickness to 0.1 µm. The material and thickness of the adhesion is chosen for the ability to bond to the chip surface and heat removal device surface and further bind to the barrier layer. Adhesive layer could also, for example, be made out of Ti/W or Cr. One of ordinary skill in the art will appreciate that the thickness of the adhesive layer, as well as the thicknesses of the barrier and protective layers, each contribute to the overall BLT.

In accordance with one or more embodiments of the claimed invention, the barrier layer is comprised of nickel and vanadium. In one or more embodiments, the barrier layer may be comprised of 97% nickel and 3% vanadium. In one or more embodiments the barrier layer is approximately 0.3 µm thick. One of ordinary skill in the art will appreciate that the barrier layer materials are not limited to nickel/vanadium, and its thickness to 0.3 µm. The barrier layer must inhibit the diffusion of the adhesion layer. In addition, the barrier layer may inhibit the formation of oxides/nitrides/carbides on the surface and, thus, preventing solder wetting. The barrier layer may also prevent any protective layer migration to the surface and the formation of brittle intermetallic compounds (IMC). The formation of brittle intermetallic compounds may lead to poor reliability. Examples of other materials that may be used in the barrier layer include, but are not limited to: nickel, nickel (phosphorous), platinum, palladium, cobalt, cobalt (phosphorous), nickel cobalt, or nickel cobalt (phosphorous).

In accordance with one or more embodiments, the protective layer is comprised primarily of gold. In one or more embodiments, the protective layer is a gold layer approximately 0.2 µm thick. One of ordinary skill in the art will appreciate that the protective layer material is not limited to gold, and its thickness to 0.2 µm. The protective layer may serve to protect the plating surface from oxidation until attachment of the chip to the heat removal device. Examples of other materials that may be used in the protective layer include, but are not limited to: platinum, silver, immersion silver, or an organic solderability preservative (OSP).

Figure 2:
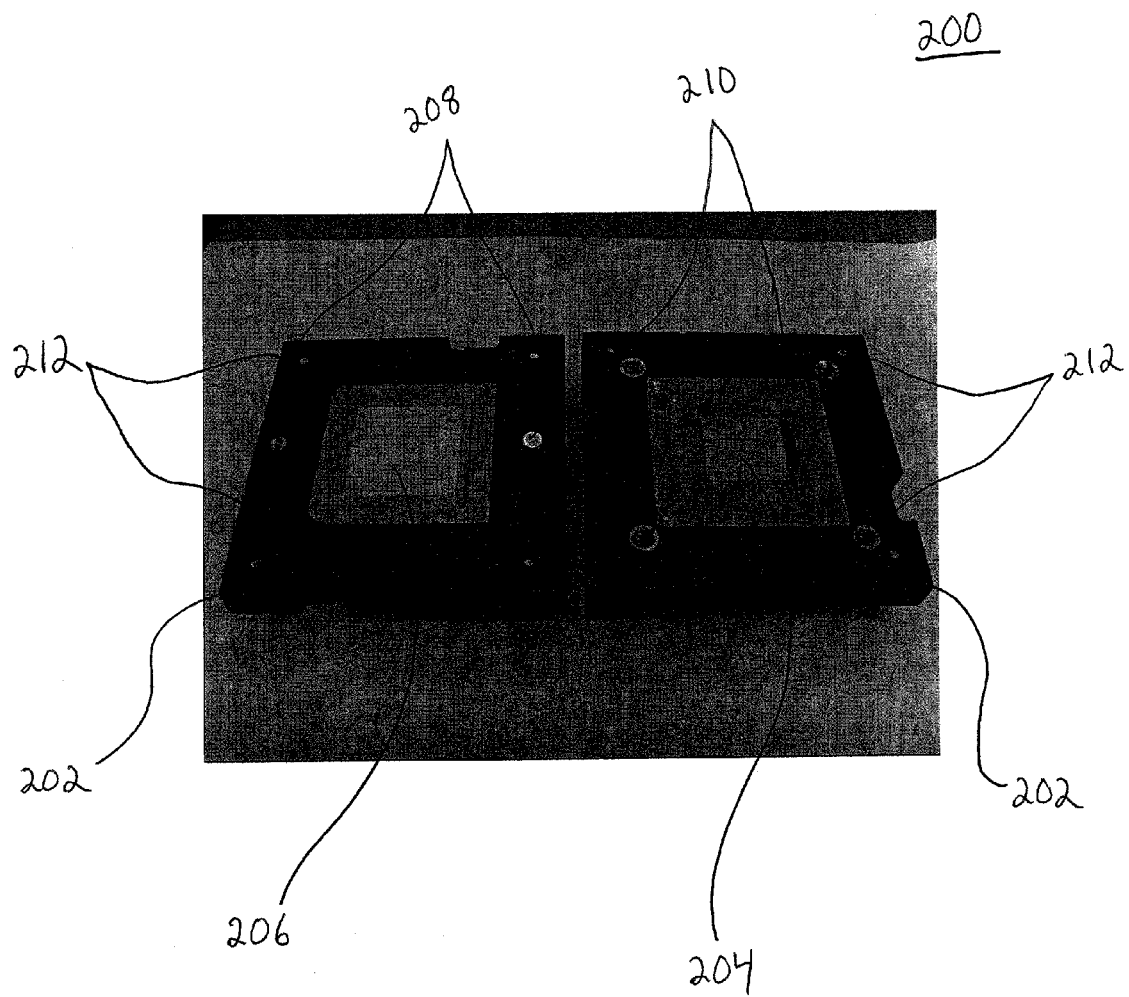
FIG. 2 shows a schematic of the carrier fixtures in accordance with one or more embodiments disclosed herein.

In ST104, the chip and the heat removal device are placed into carrier fixtures described in FIG. 2. In ST106, the carrier fixtures containing the chip and the heat removal device are preheated to a target temperature. In one or more embodiments, the metallic TIM preform is preheated to the target temperature with the carrier fixtures containing the chip and heat removal device.

In one or more embodiments of the claimed invention, a metallic TIM preform covering 90-100% of the target bonding area is used. In one or more embodiments, the metallic TIM preform is comprised of indium. The metallic TIM preform may be from 5 to 16 mils (0.125 to 0.300 mm) thick in accordance with one or more embodiments.

In one or more embodiments, the preheating target temperature may be 60° C. Optimization test of the preheating target temperature concluded that 60° C. provided reproducibility in the BLT and wetting for indium metallic TIM preform thicknesses of 5, 8, and 12 mils (0.125, 0.200, and 0.300 mm).

In ST108, the metallic TIM preform is placed on the target joining area. Alternatively, the TIM perform may be placed on the target joining area prior to ST106, so that the TIM preform, and loaded carrier fixtures may be preheated. In ST110, the metallic TIM preform is mechanically rolled on the surface of the chip. In one or more embodiments, the metallic TIM preform may be rolled on the surface of the heat removal device. Mechanically rolling the metallic TIM preform on the surface may facilitate the removal of any potentially trapped air bubbles. Also, mechanically rolling the metallic TIM preform on the surface of the chip may facilitate to planarize the metallic TIM.

In ST112, the carrier fixtures are joined such that the metallic TIM layer on the surface of the chip joined to the coated surface of the heat removal device through the target joining area. In one or more embodiments, as described in relation to FIG. 2, the carrier fixtures may be aligned and clamped into place via the carrier fixture design.

In ST114, the joined carrier fixtures may be placed in a reflow oven. The reflow of the single resulting fixture is performed using a custom temperature vs. time profile dependent on the specific materials used, the overall sizes, fixture geometry, and total mass of the different components, being joined. An example of the custom temperature vs. time profile for an adhesion layer of Ti (0.1 µm thick), a barrier layer of 97% Ni and 3% V (0.3 µm thick), a protective layer of Au (0.2 µm thick), and an In metallic TIM preform (5 mils (0.125 mm) thick) is shown.

In one or more embodiments, an adhesive is used on the perimeter of the heat removing device. The adhesive may be applied after the fixture has cooled as a result of the heating using a temperature profile (ST114) as exemplified in FIG. 4. Alternatively, the adhesive may be applied to the perimeter of the heat removing device immediately prior to the joining of the carrier fixtures (ST112). The adhesive used may be a commercially available adhesive as is known in the art.

Referring to FIG. 2, an example of the carrier fixtures in accordance with one or more embodiments of the claimed invention is shown. The carrier fixtures system 200 has two carrier fixtures 202. One carrier fixture 202 houses the chip or die 204, and the other carrier fixture 202 houses the heat removal device or lid 206. Each carrier fixture 202 may have alignment pins 208 which correspond to alignment holes 210 in the other carrier fixture 202. The alignment pins 208 and alignment holes 210 facilitate the alignment of the target joining area when joining the carrier fixtures 202. Each carrier fixture may also contain further means for joining the carrier fixtures 212. For example, each carrier fixture may contain threaded holes 212 for attaching the carrier fixtures. One of ordinary skill in the art will appreciation there are other methods for joining the carrier fixtures, for example using a separate clamping mechanism.

Figure 3:
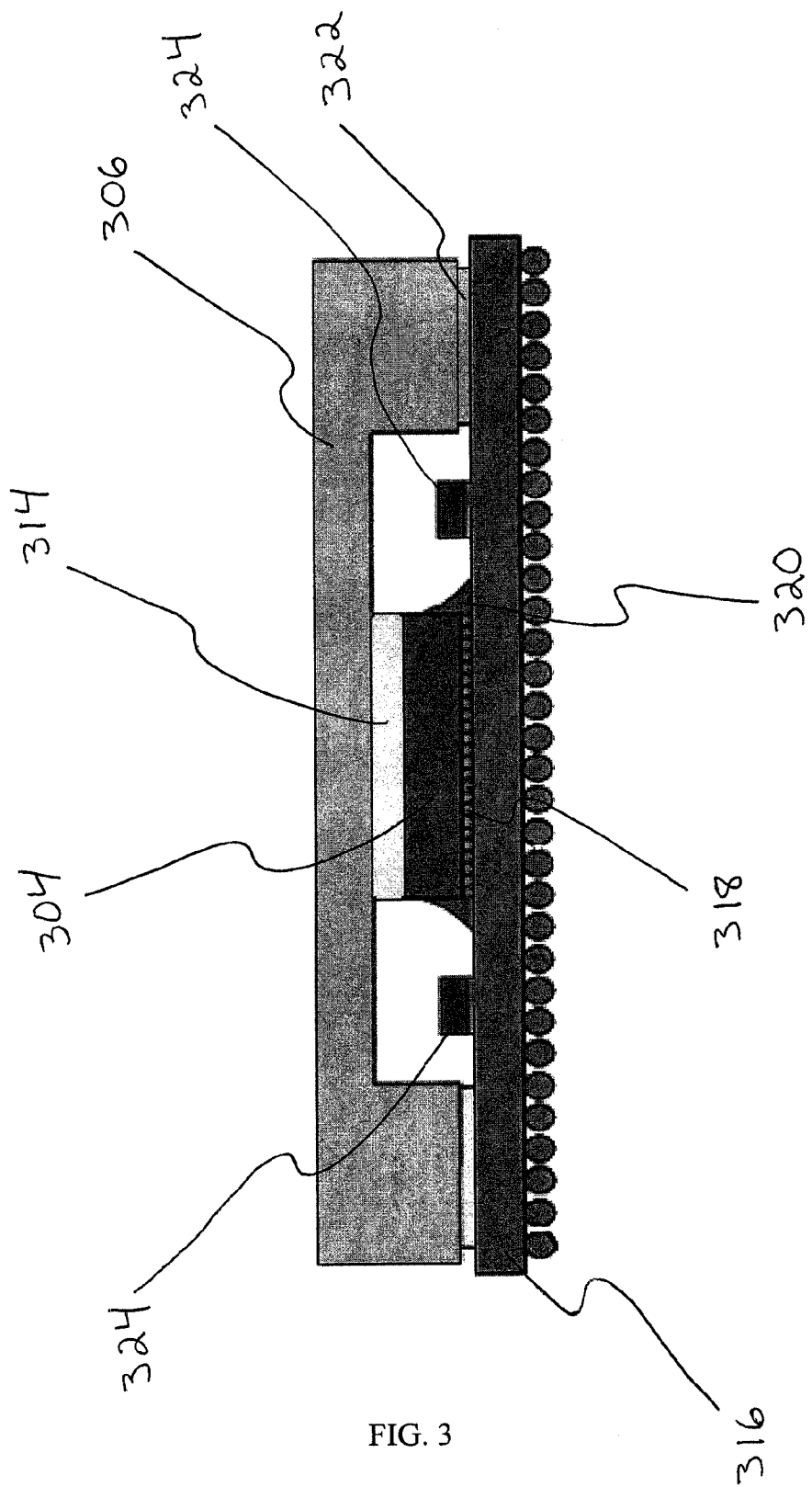
FIG. 3 is a schematic of a package in accordance with one or more embodiments disclosed herein.

Referring to FIG. 3, a schematic of an example of an assembled package in accordance with one or more embodiments of the claimed invention is shown. The chip/silicon die 304 is attached to the heat removal device/lid 306 through the TIM 314. The silicon die/chip 304 may be attached to a substrate 316 via bumps 318 and underfill 320. As described previously, a perimeter adhesive 322 may be used. The complete package may also include capacitors 324, depending on the specific package desired.

Figure 4:
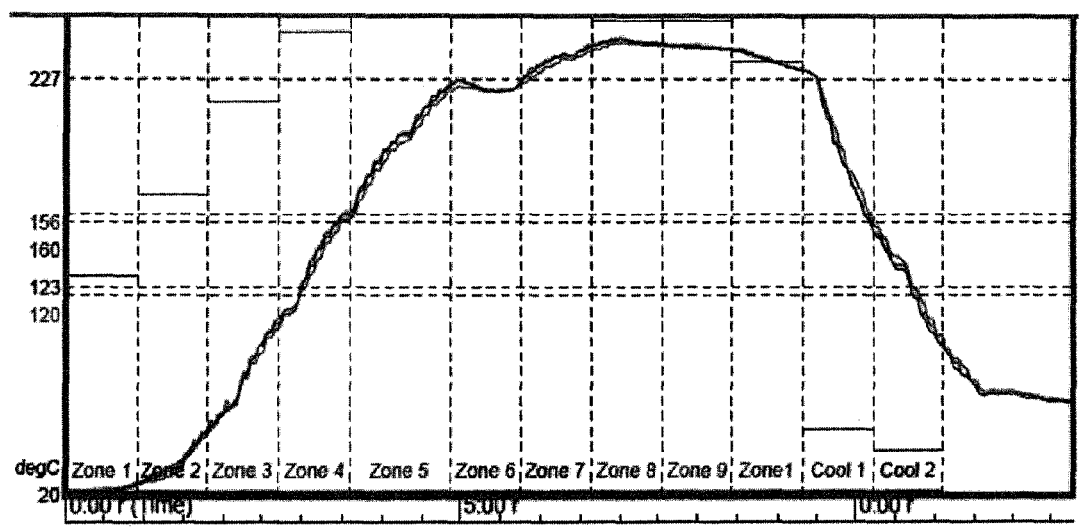
FIG. 4 is a graph of a temperature heating profile in accordance with one or more embodiments disclosed herein.

An example of a custom temperature profile vs. time used in the reflow process in accordance with one or more embodiments is shown in FIG. 4. The temperature profile shown in FIG. 4 may be used for an adhesion layer of Ti (0.1 μm thick), a barrier layer of 97% Ni and 3% V (0.3 μm thick), a protective layer of Au (0.2 μm thick), and In metallic TIM preform thicknesses in-between lower (5 mils, 0.125 mm) and upper (12 mils, 0.300 mm) bounds. The temperature profile is determined empirically and is dependent on the specific materials used, the overall sizes, fixture geometry, and total mass of the different components, being joined.

Embodiments disclosed herein may provide for one or more of the following advantages. First, embodiments disclosed herein may provide for the use of a metallic TIM material for semiconductor packaging. The use of a metallic TIM, as opposed to an organic TIM, may achieve a significantly lower thermal resistance across the TIM interface. Also, the use of a metallic TIM may allow the accommodation of the joining of any non-parallel surfaces, which in turn reduces the constraints on TIM1 BLT control. Also, a metallic TIM may provide a means for a thicker BLT, if necessary, to alleviate any structural issues, without measurably impacting thermal performance.

Also, embodiments disclosed herein may provide for a fluxless process. A fluxless process may reduce the number of process steps overall. A fluxless process may improve the quality of the chip/heat removal device overall by eliminating any flux residue for the components involved and further eliminate any cleaning steps involved in a flux process. Flux residue is known to affect the thermal conductivity and, accordingly, the elimination of any flux residue may improve the overall thermal conductivity of the device. The embodiments of the methods described herein are compliant with Restriction of Hazardous Substances (ROHS) and may produce a substantially void-free interface resulting in better thermal and structural performance.

Furthermore, it should be understood by those having ordinary skill that the present disclosure shall not be limited to specific examples depicted in the Figures and described in the specification. While the present disclosure has been described with respect to a limited number of embodiments, those skilled in the art, having benefit of this disclosure, will appreciate that other embodiments may be devised which do not depart from the scope of the disclosure as described herein. Accordingly, the scope of the invention should be limited only by the attached claims.

What is claimed is:

1. A semiconductor package assembly method comprising:
   cleaning a surface of a chip and a surface of a heat removal device by reverse sputtering;
   sequentially coating the surface of the chip and the surface of the heat removal device with an adhesive layer, a barrier layer, and a protective layer over a target joining area;
   placing the chip and the heat removal device into a first and second carrier fixture, respectively;
   preheating the first and second carrier fixtures to a target temperature;
   placing a metallic thermal interface material preform on the surface of the chip after preheating;
   mechanically rolling the metallic thermal interface material on the surface of the chip;
   attaching the first and the second carrier fixtures such that the metallic thermal interface material layer on the surface of the chip is joined to the coated surface of the heat removal device; and
   heating the joined carrier fixtures in a reflow oven.

2. The method of claim 1, wherein the method is fluxless.

3. The method of claim 1, further comprising:
   applying an adhesive to the perimeter of the heat removing device after the joined carrier fixtures have cooled as a result of the heating profile.

4. The method of claim 1, further comprising:
   applying an adhesive to the perimeter of the heat removing device prior to attaching the first and second carrier fixtures.

5. The method of claim 1, wherein the target temperature is at least 60° C.

6. The method of claim 1, wherein 100% of the target joining area is coated with the adhesive layer, the barrier layer, and the protective layer.

7. The method of claim 6, wherein the coating of the adhesive layer, the barrier layer, and the protective layer is performed by sputter coating.

8. The method of claim 1, wherein the metallic thermal interface material preform covers 90% to 100% of the target joining area.

9. The method of claim 1, further comprising preheating the metallic thermal interface material preform with the first and second carrier fixtures.

10. The method of claim 1, further comprising chemically cleaning the surface of the chip, the surface of a heat removal device, and the metallic thermal interface material preform prior to preheating.

11. The method of claim 10, wherein the chemical cleaning comprises:
    degreasing the surface of the chip, the surface of a heat removal device, and the metallic thermal interface material preform with acetone, followed by rinsing the surface of the chip, the surface of a heat removal device, and the metallic thermal interface material preform with isopropyl alcohol;
    etching the surface of the chip, the surface of a heat removal device, and the metallic thermal interface material preform with hydrochloric acid, followed by rinsing the surface of the chip, the surface of a heat removal device, and the metallic thermal interface material preform with deionized water; and
    blowing dry the surface of the chip, the surface of a heat removal device, and the metallic thermal interface material preform with nitrogen.

12. The method of claim 1, wherein the metallic thermal interface material comprises indium.

13. The method of claim 1, wherein the adhesive layer is titanium and is approximately 0.1 microns thick.

14. The method of claim 1, wherein the barrier layer comprises nickel and vanadium and is approximately 0.3 microns thick.

15. The method of claim 1, wherein the barrier layer is 97% nickel and 3% vanadium.

16. The method of claim 1, wherein the protective layer is gold and is approximately 0.2 microns thick.

17. A semiconductor package with a substantially void-free interface, wherein the semiconductor package is assembled by a method comprising:
    cleaning a surface of a chip and a surface of a heat removal device by reverse sputtering;
    sequentially coating the surface of the chip and the surface of the heat removal device with an adhesive layer, a barrier layer, and a protective layer over a target joining area;

placing the chip and the heat removal device into a first and second carrier fixture, respectively;

preheating the first and second carrier fixtures to a target temperature;

placing a metallic thermal interface material preform on the surface of the chip after preheating;

mechanically rolling the metallic thermal interface material on the surface of the chip;

attaching the first and the second carrier fixtures such that the metallic thermal interface material layer on the surface of the chip is joined to the coated surface of the heat removal device; and heating the joined carrier fixtures in a reflow oven.

18. The semiconductor package of claim 17, wherein the method is fluxless.

* * * * *